United States Patent [19]

Alexander

[11] Patent Number: 5,586,011
[45] Date of Patent: Dec. 17, 1996

[54] SIDE PLATED ELECTROMAGNETIC INTERFERENCE SHIELD STRIP FOR A PRINTED CIRCUIT BOARD

[75] Inventor: Arthur R. Alexander, Valley Center, Calif.

[73] Assignee: AT&T Global Information Solutions Company, Dayton, Ohio

[21] Appl. No.: 297,346

[22] Filed: Aug. 29, 1994

[51] Int. Cl.$^6$ ....................................................... H05K 9/00
[52] U.S. Cl. .......................... 361/818; 361/800; 361/816; 174/35 R; 257/660
[58] Field of Search ..................................... 361/788, 818, 361/816, 800, 796; 174/35 R; 257/660, 659, 728; 333/246, 247; 439/108, 109, 607

[56] References Cited

U.S. PATENT DOCUMENTS

| | | | |
|---|---|---|---|
| 4,370,700 | 1/1983 | Duddles et al. ......................... | 361/424 |
| 4,408,256 | 10/1983 | Val .......................................... | 361/403 |
| 4,658,334 | 4/1987 | McSparran et al. ...................... | 361/415 |
| 4,668,332 | 5/1987 | Ohnuki et al. ............................ | 156/630 |
| 4,882,454 | 11/1989 | Peterson et al. ......................... | 174/68.5 |
| 5,119,047 | 6/1992 | Brown et al. .............................. | 333/12 |

*Primary Examiner*—Leo P. Picard
*Assistant Examiner*—Y. Whang
*Attorney, Agent, or Firm*—James M. Stover

[57] ABSTRACT

An electric circuit board including EMI shielding. The board comprises a substrate including top and bottom surfaces and at least one internal ground layer, the internal ground layer being electrically insulated from the external surfaces of the substrate. A plurality of vias are formed in the substrate near the edges of the substrate, each via providing an opening from the surface of the substrate to the internal ground layer. A metal plating is applied to the vias, the edges of the substrate and the perimeter of the surface of the substrate, the metal plating along the substrate perimeter being applied over the plated-up vias to electrically connect the ground plane with the metal plating applied to the edges of the substrate.

7 Claims, 2 Drawing Sheets

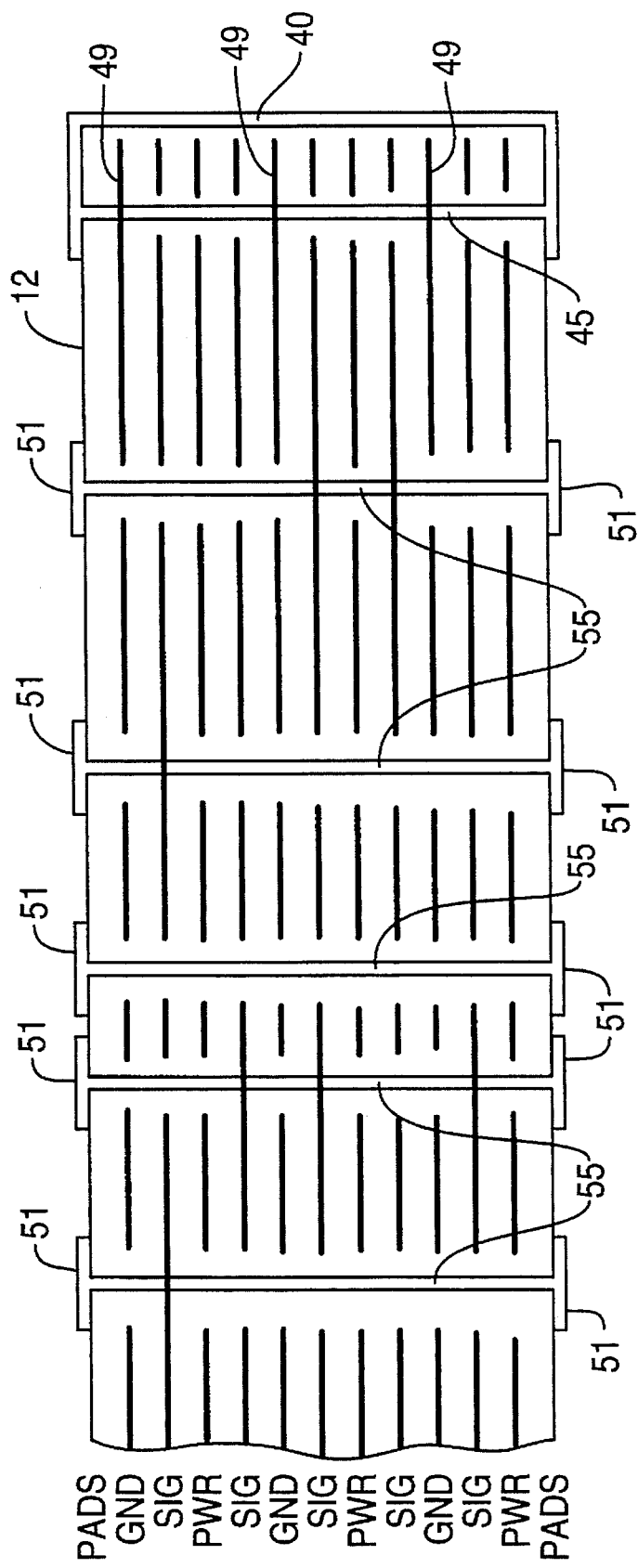

5,586,011

SIDE PLATED ELECTROMAGNETIC INTERFERENCE SHIELD STRIP FOR A PRINTED CIRCUIT BOARD

The present invention relates to electromagnetic interference (EMI) shielding of electronic printed circuit boards and, more particularly, to a method for edge plating electronic printed circuit boards to reduce EMI emissions.

BACKGROUND OF THE INVENTION

Electromagnetic interference, referred to as EMI, is any unwanted electromagnetic energy radiated from an electronic device. An electronic device, such as a printed circuit board or backpanel, which is not properly designed or shielded to protect against EMI emissions may generate EMI radiation which can compromise the operation of adjacent electronic devices. Likewise, the operation of an improperly protected device may be compromised by emissions received from external EMI sources or from EMI sources within the device itself.

The increase in electronic component clock frequencies and the adoption of increasingly stringent regulations in the United States and Europe governing EMI emissions has elevated the need to factor EMI considerations into the design and construction of electronic devices such as logic and circuit boards.

A printed circuit board or backpanel will have reduced EMI emissions when the edges of the board substrate must be sealed with metal. Several methods are known for edge sealing substrates, including: soldering of a metal foil strip around the edges of the substrate, plating metal onto the edges of the substrate, painting the edges of the substrate with conductive paint, or inserting a metal gasket around the edges of the substrate. The metal edging must connect to a ground plane within the substrate to properly insulate the substrate. Most of these methods suffer from disadvantages such as high cost or degraded performance, which may be caused by an air gap between the metal shielding and the substrate.

OBJECTS OF THE INVENTION

It is therefore an object of the present invention to provide a new and useful method for edge shielding printed circuit board and backpanel substrates to reduce EMI emissions.

It is another object of the present invention to provide such a method for edge shielding substrates which is simple and inexpensive.

It is yet another object of the present invention to provide a new and useful method for edge shielding printed circuit board and backpanel substrates wherein metal plating is applied to the edges of the substrate in a manner similar to the plating through of via openings in the substrate.

SUMMARY OF THE INVENTION

There is provided, in accordance with the present invention, an electric circuit board including EMI shielding. The board comprises a substrate including top and bottom surfaces and at least one internal ground layer, the internal ground layer being electrically insulated from the external surfaces of the substrate. A plurality of vias are formed in the substrate near the edges of the substrate, each via providing an opening from the surface of the substrate to the internal ground layer A metal plating is applied to the vias, the edges of the substrate and the perimeter of the surface of the substrate, the metal plating along the substrate perimeter being applied over the plated-up vias to electrically connect the ground plane with the metal plating applied to the edges of the substrate.

The disclosure which follows also describes a method for providing EMI edge shielding to an electrical circuit board substrate which includes top and bottom surfaces and at least one internal ground layer, the internal ground layer being electrically insulated from the external surfaces of the substrate. The method includes the steps of: forming a plurality of vias near the edges of the substrate, each via providing an opening from the surface of the substrate to the ground layer; and applying metal plating to the vias, the edges of the substrate and the perimeter of the surface of the substrate, the metal plating along the perimeter being applied over the plate-up vias to electrically connect the ground plane with the metal plating applied to the edges of the substrate.

The above and other objects, features, and advantages of the present invention will become apparent from the following description and the attached drawings.

BRIEF DESCRIPTION OF THE DRAWINGS

FIG. 3 is a sectional view through a portion of the backpanel of FIG. 1, showing the metallic edge shielding and associated plated via openings in accordance with the present invention.

DETAILED DESCRIPTION OF THE PREFERRED EMBODIMENT

Figure 1:
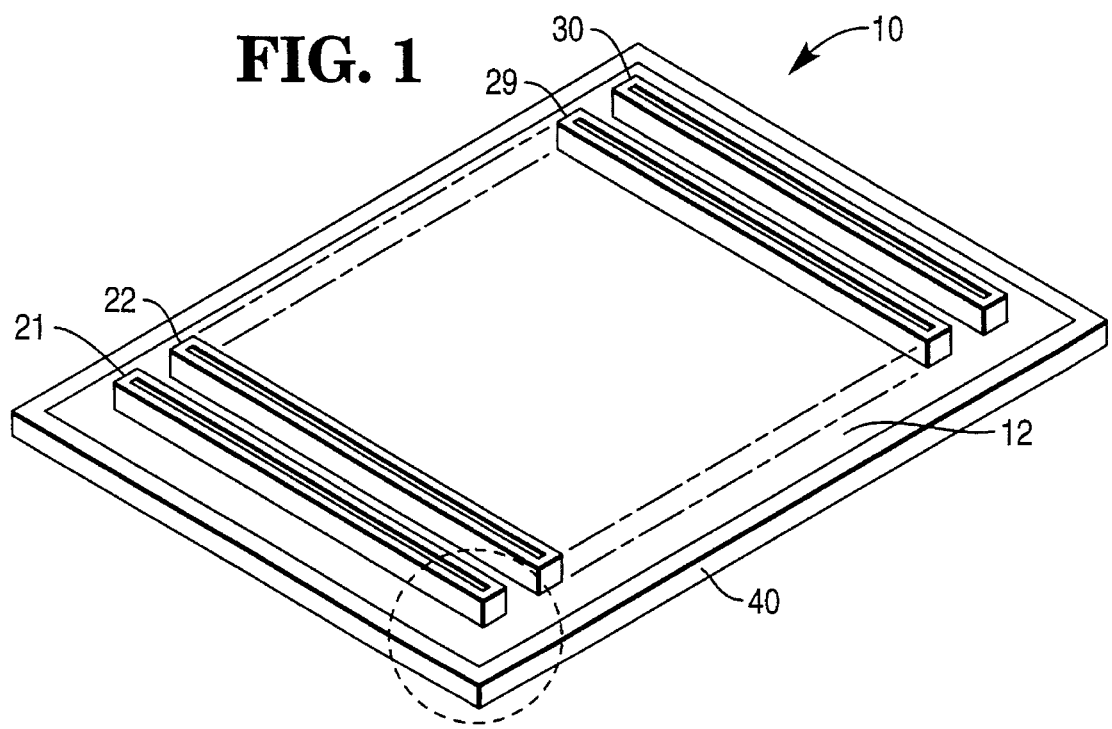
FIG. 1 is an isometric view of a rectangular backpanel for a computer system, the backpanel including EMI metallic edge shielding in accordance with the present invention.

Referring now to FIG. 1, there is seen an isometric view of a rectangular backpanel 10 for a computer system. The backpanel includes a printed circuit substrate 12 and a plurality of sockets or connectors 21 through 30 mounted upon the substrate surface for receiving printed circuit boards (not shown). The connectors 21 through 28, and possibly other logic components mounted onto the backpanel, are interconnected by a common set of address, data and control transmission lines, not shown in FIG. 1, integrated within the backpanel substrate. Metallic shielding 40 is shown along the edges of substrate 12.

Figure 2:
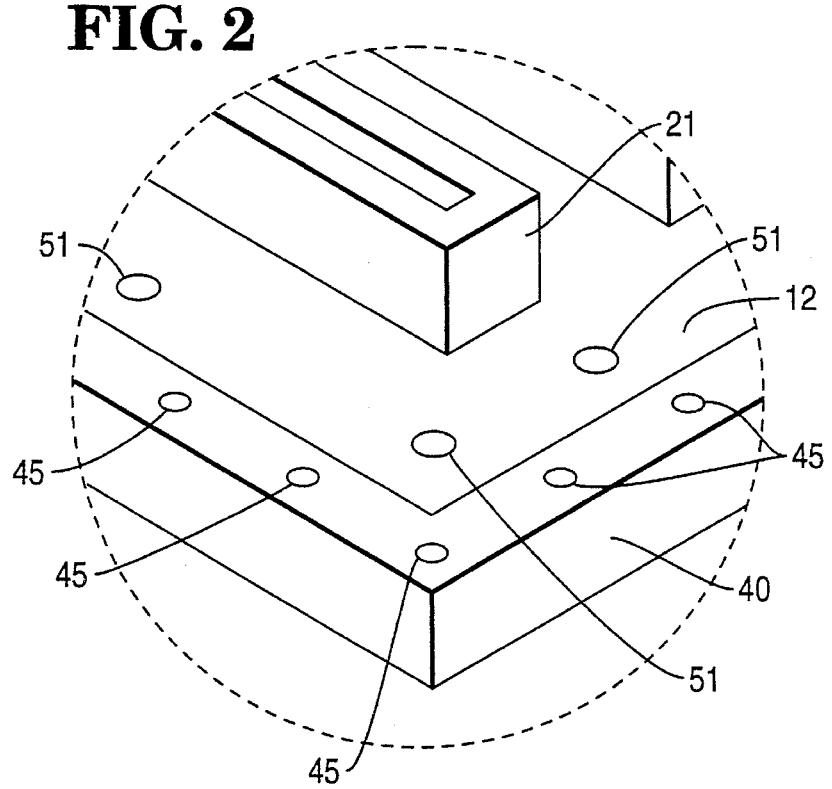
FIG. 2 is an enlarged isometric view of a corner portion of the backpanel of FIG. 1, showing metallic edge shielding and associated plated via openings in accordance with the present invention.

An enlarged isometric view of a corner portion of backpanel 10 is shown in FIG. 2. The metallic edge shielding 40 applied to the edges of substrate 12 is seen to wrap around the edges of the substrate onto the top and bottom surfaces. Plated-up via holes 45 provide electrical connection between the metallic edge shielding 40 and ground tracings within the substrate.

FIG. 3 provides a sectional view through a portion of the backpanel substrate 12, showing the metallic edge shielding 40 and associated plated via openings 45. The backpanel substrate shown is formed with several internal power, ground and signal layers, identified by reference characters PWR, GND and SIG, respectively. The signal layers SIG are alternated with the power PWR and ground GND layers, also identified by reference numeral 49, within the substrate. Signal traces included in the signal layers are electrically connected with pads 51 on the surfaces of the substrate through plated-up via holes 55. These pads provide connection points for components located on the surface of the substrate. A representative one of plated-up vias 45 is shown connecting the metallic edge plating with ground traces within ground layers 49.

Backpanel substrate 12 is developed through the various power, ground and signal layers utilizing standard processing techniques. Similarly, via holes 45 from the surface of the substrate to ground layers 49, and via holes 55 from the surface of the substrate to the various signal layers within the substrate are also formed though standard processing techniques, such as masking and dry etch processing techniques. Via openings 45 are formed near the edge of the substrate to provide connections between the edge shielding and the substrate internal ground layers.

During the etch process, wherein metal features on the surfaces of substrate 12 such as surface traces and pads 51 are defined, a margin strip of copper is left along the perimeter of the top and bottom surfaces of the backpanel substrate. This margin strip extends from the edge of the substrate beyond via openings 45. Metallic edge plating 40 is thereafter applied employing the same process as used for plating through the via openings 45 and 55.

It can thus be seen that there has been provided by the present invention a simple and inexpensive method for edge shielding printed circuit board and backpanel substrates to prevent EMI emissions. The method eliminates air gaps between the metal shielding and the substrate and the problems associated therewith.

Although the presently preferred embodiment of the invention has been described, it will be understood that various changes may be made within the scope of the appended claims.

What is claimed is:

1. A shielded electric circuit board, comprising:

a substrate including top and bottom external surfaces and at least one internal ground layer, said internal ground layer being electrically insulated from the external surfaces of said substrate;

a first plurality of vias near the edges of said substrate, each one of said vias providing an opening from the surface of said substrate to said ground layer; and metal plating applied to said vias, the edges of said substrate and a perimeter region of the surfaces of said substrate, said metal plating along the perimeter being applied over said vias to electrically connect said ground plane with the metal plating applied to the edges of said substrate.

2. The shielded electric circuit board in accordance with claim 1, wherein said a substrate includes at least one internal signal layer, said signal layer being co-planar with said internal ground layer and being electrically insulated from said ground layer and the external surfaces of said substrate.

3. The shielded electric circuit board in accordance with claim 1, further comprising:

a second plurality of vias, each one of said second plurality of vias providing an opening from the surface of said substrate to said signal layer, said second plurality of vias being located outside said perimeter region of said substrate surfaces.

4. The shielded electric circuit board in accordance with claim 1, wherein said substrate includes a plurality of ground layers, each ground layer being connected through said first plurality of vias to said metal plating applied to said perimeter regions and said substrate edges.

5. The shielded electric circuit board in accordance with claim 2, wherein:

said substrate includes a plurality of ground layers, power layers and signal layers, said signal layers being alternated with said ground and power layers each ground layer is connected through said first plurality of vias to said metal plating applied to said perimeter regions and said substrate edges each ground layer being connected through said first plurality of vias to said metal plating applied to said perimeter regions and said substrate edges.

6. A method for providing EMI edge shielding to a substrate, said substrate including top and bottom surfaces and at least one internal ground layer, said internal ground layer being electrically insulated from the external surfaces of said substrate, the steps comprising:

forming a plurality of vias near the edges of said substrate, each one of said vias providing an opening from the surface of said substrate to said ground layer; and applying metal plating to said vias, the edges of said substrate and a perimeter region of said surfaces of said substrate, said metal plating along the perimeter region being applied over said vias to electrically connect said ground layer with the metal plating applied to the edges of said substrate.

7. A method for providing EMI edge shielding to a substrate, said substrate including top and bottom surfaces at least one internal ground layer, and at least one internal signal layer, said ground layer and said signal layers being co-planar with said surfaces and being electrically insulated from said surfaces and each other, the steps comprising:

defining a perimeter region near the edges of said top and bottom surfaces;

forming a first plurality of vias within said perimeter region, each one of said first plurality of vias providing an opening from the surface of said substrate to said ground layer;

forming a second plurality of vias outside of said perimeter region, each one of said second plurality of vias providing an opening from the surface of said substrate to said signal layer; and applying metal plating to said vias, the edges of said substrate and said perimeter regions, said metal plating along said perimeter regions being applied over said first plurality of vias to electrically connect said ground layer with the metal plating applied to the edges of said substrate.

* * * * *